US010784218B2

(12) United States Patent
Xiao et al.

(10) Patent No.: US 10,784,218 B2
(45) Date of Patent: Sep. 22, 2020

(54) DISPLAY DEVICE AND PREPARATION METHOD THEREFOR

(71) Applicant: BOE TECHNOLOGY GROUP CO., LTD., Beijing (CN)

(72) Inventors: Li Xiao, Beijing (CN); Tingting Zhou, Beijing (CN); Xiaochuan Chen, Beijing (CN); Shengji Yang, Beijing (CN); Dongni Liu, Beijing (CN); Lei Wang, Beijing (CN); Jie Fu, Beijing (CN); Pengcheng Lu, Beijing (CN); Han Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/317,658

(22) PCT Filed: May 10, 2018

(86) PCT No.: PCT/CN2018/086284
§ 371 (c)(1),
(2) Date: Jan. 14, 2019

(87) PCT Pub. No.: WO2018/228095
PCT Pub. Date: Dec. 20, 2018

(65) Prior Publication Data
US 2019/0295973 A1 Sep. 26, 2019

(30) Foreign Application Priority Data
Jun. 12, 2017 (CN) .......................... 2017 1 0449847

(51) Int. Cl.
H01L 23/00 (2006.01)
H01L 27/12 (2006.01)
(Continued)

(52) U.S. Cl.
CPC .............. *H01L 24/05* (2013.01); *H01L 24/03* (2013.01); *H01L 27/12* (2013.01);
(Continued)

(58) Field of Classification Search
CPC ..... H01L 24/05; H01L 27/12; H01L 27/3244; H01L 24/03; H01L 2227/32;
(Continued)

(56) References Cited

U.S. PATENT DOCUMENTS 6,380,687 B1 * 4/2002 Yamazaki ............ G09G 3/3233
315/169.1
2002/0093056 A1 7/2002 Cai et al.
(Continued)

FOREIGN PATENT DOCUMENTS

CN 1913146 A 2/2007
CN 101122724 A 2/2008
(Continued)

OTHER PUBLICATIONS

International Search Report and Written Opinion dated Aug. 1, 2018.
First Chinese Office Action dated May 30, 2019.

*Primary Examiner* — Kyoung Lee
(74) *Attorney, Agent, or Firm* — Dilworth & Barrese, LLP.; Michael J. Musella, Esq.

(57) ABSTRACT

The present disclosure provides a display apparatus and a manufacturing method thereof. The display apparatus includes a silicon substrate, a plurality of metal data interfaces disposed on the silicon substrate, and a plurality of conductive patterns covering upper surfaces of the metal data interfaces respectively. The plurality of the conductive patterns is formed by enabling a semiconductor material to be conductive and the plurality of conductive patterns are not contacted with each other.

14 Claims, 4 Drawing Sheets

(51) Int. Cl.
*H01L 27/32* (2006.01)
*G02F 1/1345* (2006.01)

(52) U.S. Cl.
CPC ...... *H01L 27/3244* (2013.01); *G02F 1/13452* (2013.01); *H01L 27/3276* (2013.01); *H01L 2224/03019* (2013.01); *H01L 2224/05686* (2013.01); *H01L 2227/32* (2013.01); *H01L 2227/323* (2013.01); *H01L 2924/0549* (2013.01); *H01L 2924/10253* (2013.01)

(58) Field of Classification Search
CPC ..... H01L 2227/323; H01L 2924/10253; H01L 2924/0549; H01L 2224/05686; H01L 2224/03019; H01L 27/3276; H01L 27/3241; G02F 1/13452; G02F 1/13458; G02F 2202/10
See application file for complete search history.

(56) References Cited

U.S. PATENT DOCUMENTS

| | | |
|---|---|---|
| 2007/0034954 A1 | 2/2007 | Cho et al. |
| 2008/0252204 A1* | 10/2008 | Yoshida ............ H01L 51/5203 313/504 |
| 2010/0065842 A1 | 3/2010 | Yamazaki et al. |
| 2011/0204370 A1 | 8/2011 | Yoon et al. |
| 2014/0346458 A1 | 11/2014 | Park et al. |
| 2015/0077953 A1 | 3/2015 | Namkung et al. |
| 2019/0172849 A1 | 6/2019 | Sakata et al. |

FOREIGN PATENT DOCUMENTS

| | | |
|---|---|---|
| CN | 104091811 A | 10/2014 |
| CN | 104183602 A | 12/2014 |
| CN | 104464517 A | 3/2015 |
| CN | 104681627 A | 6/2015 |
| CN | 107275342 A | 10/2017 |

* cited by examiner

DISPLAY DEVICE AND PREPARATION METHOD THEREFOR

The application claims priority of the Chinese patent application No. 201710449847.1, filed on Jun. 12, 2017, the entire disclosure of which is incorporated herein by reference as part of the present application.

TECHNICAL FIELD

The present disclosure relates to a display apparatus and a manufacturing method thereof.

BACKGROUND

A silicon substrate manufactured with a complementary metal oxide semiconductor (CMOS) drive circuit is employed as a base substrate of a novel micro-display apparatus, thereby combining an existing display with a silicon substrate drive circuit, so that the display apparatus has advantages of both of them. The CMOS technology has the characteristics of low cost, small size and the like, and is the base of the integrated circuit industry. Combining the existing display apparatus with the CMOS process can reduce the total number of system chips, thereby reducing the cost and power consumption of the system and reducing the product size, and has broad application prospects. Such a micro-display apparatus can be applied to head-mounted displays, portable computers, virtual reality displays, medical electronics, and military electronics and the like.

SUMMARY

Some embodiments of the disclosure provide a display apparatus, comprising a silicon substrate, a plurality of metal data interfaces disposed on the silicon substrate, and a plurality of conductive patterns covering upper surfaces of the plurality of metal data interfaces respectively, wherein the plurality of conductive patterns is formed by enabling a semiconductor material to be conductive, and the plurality of the conductive patterns are not contacted with each other.

In some examples, an orthographic projection of each of the conductive patterns on the silicon substrate coincides with an orthographic projection of a corresponding metal data interface on the silicon substrate.

In some examples, an orthographic projection of each of the conductive patterns on the silicon substrate covers an orthographic projection of a corresponding metal data interface on the silicon substrate.

In some examples, a material of the conductive patterns is a metal oxide which is subjected to a conduction-enabling process.

In some examples, the display apparatus further comprises a display device disposed on the silicon substrate, wherein the display device comprises a liquid crystal display device or an organic electroluminescent diode.

In some examples, the display apparatus further comprises a display region and a peripheral region located at a periphery of the display region, the display device is located in the display region, and the plurality of the metal data interfaces are located in the peripheral region.

In some examples, the display apparatus further comprises a drive circuit connected to the metal data interfaces.

In some examples, each of the conductive patterns covers an upper surface and side surfaces of a corresponding metal data interface.

Some embodiments of the disclosure provide a manufacturing method of a display apparatus comprising: forming a plurality of metal data interfaces on a silicon substrate; forming protection patterns with a material of semiconductor on the silicon substrate formed with the metal data interfaces, so that the protection patterns cover upper surfaces of the metal data interfaces, wherein the protection patterns are not contacted with each other; forming a display device on the silicon substrate formed with the protection patterns.

In some examples, the manufacturing method further comprises: after forming the package device, enabling the protection patterns to be conductive, or removing the protection patterns.

In some examples, forming the protection patterns comprises: forming a semiconductor thin film on the silicon substrate formed with the metal data interfaces, and forming the protection patterns by one patterning process.

In some examples, a material of the semiconductor thin film is CAAC-IGZO.

In some examples, enabling the protection patterns to be conductive comprises: hydrogenating the protection patterns to enable the protection patterns to be conductive.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

REFERENCE SIGNS

01—pixel circuit array; 02—data interface module; 03—vertical drive circuit; 04—horizontal drive circuit; 11—silicon-based drive circuit; 12—metal data interface; 13—silicon substrate; 14—conductive pattern; 14'—protection pattern; 20—display device; 30—package structure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
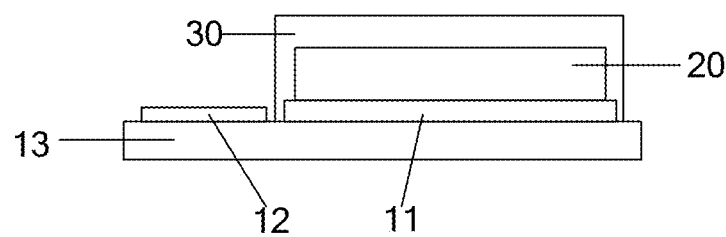
FIG. 1 is a schematic structural diagram of a display apparatus provided by the prior art.

In a process of manufacturing a display apparatus, as shown in FIG. 1, a silicon based drive circuit 11 and a metal data interface (PAD) 12 are formed on a silicon substrate 13, and a display device 20 and a package device 30 are formed on a surface of the silicon substrate 13. The metal PAD 12 is formed in synchronization with the metal layer of the silicon based drive circuit 11. In order to ensure that the metal PAD 12 will not be damaged during the subsequent process of manufacturing the display, it is necessary to protect the metal PAD 12 after it has been manufactured. For example, after the manufacturing of the metal PAD12 is completed, a photoresist is formed on the surface of the metal PAD12 by exposure and development to block the metal PAD12. After the manufacturing of the display apparatus is completed, the region where the photoresist is located is irradiated with a laser beam to ablate the photoresist into a powder, to expose the metal PAD12. However, in this method, because the photoresist is a semi-solid substance, bubbles may be inside the photoresist, and when the display device is manufactured on the silicon substrate, the bubbles inside the photoresist release oxygen, so that a film layer of the display device is oxidized, to lower the brightness of the display apparatus, thereby affecting the yield of the display apparatus.

Figure 2:
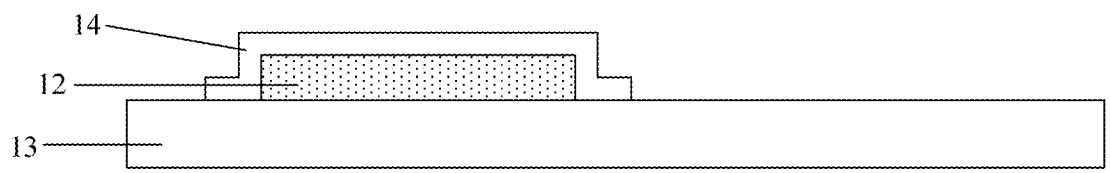
FIG. 2 is a schematic structural diagram of a display apparatus provided by an embodiment of the present disclosure.
Figure 3:
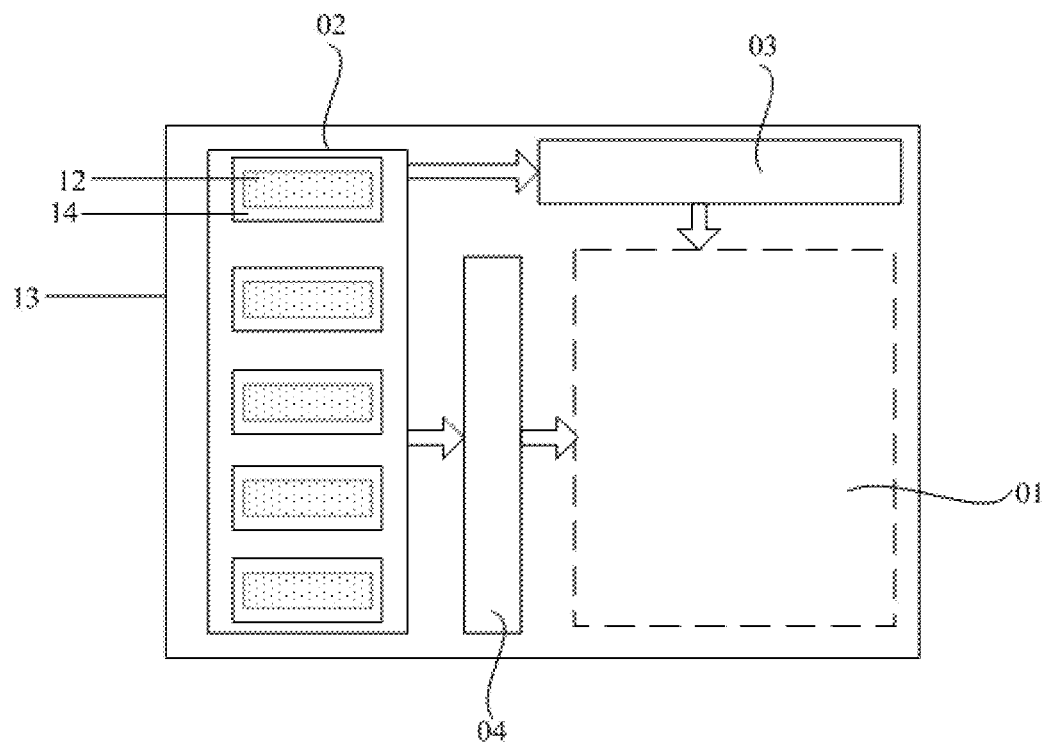
FIG. 3 is a top schematic diagram of a display apparatus provided by an embodiment of the present disclosure.

An embodiment of the present disclosure provides a display apparatus, as shown in FIGS. 2 and 3, comprising a silicon substrate 13, a plurality of metal data interfaces 12 disposed on the silicon substrate 13, and a plurality of conductive patterns 14 covering upper surfaces of the plurality of the metal data interfaces 12, respectively; the conductive patterns 14 are formed by enabling a semiconductor material to be conductive. The plurality of the conductive patterns 14 are not contacted with each other.

It should be noted that, firstly, the metal data interfaces 12 can also be referred to as metal electrodes, metal PADs, metal pin patterns, etc., for connection with other chips or circuit boards to input an electrical signal to the display apparatus.

Secondly, as shown in FIG. 3, the display apparatus comprises a pixel circuit array 01, a data interface module 02, a vertical drive circuit 03, and a horizontal drive circuit 04. The metal data interfaces 12 are disposed within the data interface module 02, to connect an external input signal with the vertical drive circuit 03 and the horizontal drive circuit 04 respectively to transmit an external input signal to the inside of the micro-display. The data interface module 02, the vertical drive circuit 03, and the horizontal drive circuit 04 are all located in a non-display region of the display apparatus.

Thirdly, those skilled in the art should understand that, in order to ensure to transmit signals independently, the metal data interfaces 12 are independent from each other. As shown in FIG. 3, the plurality of the conductive patterns 14, covering the surfaces of the plurality of the metal data interfaces 12 respectively, are also independent from each other.

The conductive pattern 14 covers the upper surfaces of the metal data interfaces 12. Here, the upper surface refers to a surface of the metal data interface 12 away from the silicon substrate 13, and the upper surface is determined from the sequential order of manufacturing.

In addition, the conductive patterns 14 cover the upper surfaces of the metal data interfaces 12, that is, the conductive pattern 14 and the metal data interface 12 can have the same shape, or the conductive pattern 14 can be slightly larger than the metal data interface 12, as long as the conductive patterns 14 are not contacted with each other.

Fourthly, the conductive pattern 14 is formed by enabling a semiconductor material to be conductive, that is, the material of the conductive pattern 14 is initially a semiconductor, and later is converted into a conductor by a conduction-enabling process. For example, the conductive pattern 14 can be formed by patterning a semiconductor film, and then enabling the patterned structure to be conductive to make it convert from a semiconductor pattern to a conductive pattern.

Fifthly, the silicon substrate can be, for example but not limited to, a silicon substrate formed of single crystal silicon or polycrystalline silicon.

In the display apparatus provided by the embodiment of the present disclosure, a conductive pattern 14 is provided on the upper surface of the metal data interface 12, and the conductive pattern 14 is obtained by enabling the semiconductor material to be conductive, so that the conductive pattern 14 has different properties at different stages, thereby having different functions. The material of the final conductive pattern 14 is a conductor and does not affect the use of the metal data interface. For example, the conductive pattern 14 is a semiconductor material when the conductive pattern is manufactured, and at this time, the conductive pattern 14 can prevent the metal data interface 12 from being damaged when the display device is manufactured on the silicon substrate 13. Moreover, the conductive pattern 14 of the semiconductor material can also avoid affecting other film layers of the display apparatus, thereby improving the yield of the display apparatus. After the manufacturing of the display device is completed, the conductive pattern 14 is subjected to a conduction-enabling process to ensure the electrical conductivity of the metal data interface 12.

Figure 4:
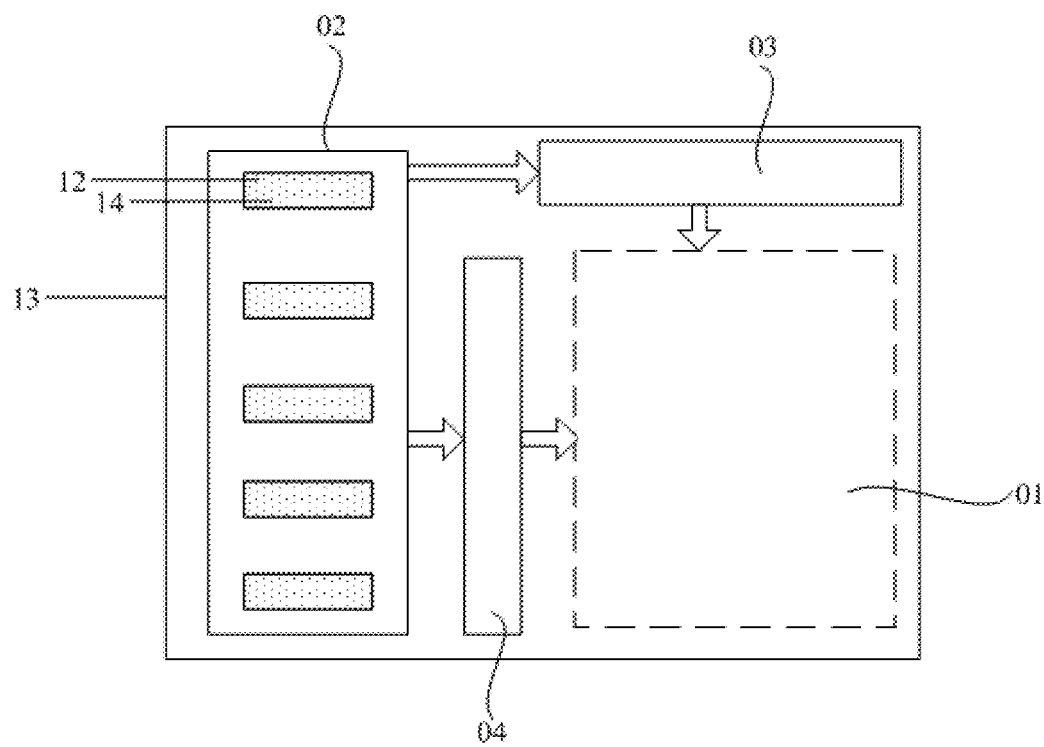
FIG. 4 is another top schematic diagram of a display apparatus provided by an embodiment of the present disclosure.

Alternatively, as shown in FIG. 4, an orthographic projection of the conductive pattern 14 on the silicon substrate 13 coincides with an orthographic projection of the metal data interface 12 on the silicon substrate 13. That is, the conductive pattern 14 is the same as the pattern of the metal data interface 12, to just cover the upper surface of the metal data interface 12.

In the embodiment of the present disclosure, by the conductive pattern 14 covering the upper surface of the metal data interface 12, the arrangement density of the metal data interfaces 12 can be increased, and an occupied area of the data interface module 02 can be reduced.

Alternatively, as shown in FIG. 3, the orthographic projection of the conductive pattern 14 on the silicon substrate 13 covers the orthographic projection of the metal data interface 12 on the silicon substrate 13. That is, the conductive pattern 14 is slightly larger than the pattern of the metal data interface 12, to cover the upper surface and sides of metal data interface 12.

In the embodiment of the present disclosure, the conductive pattern 14 covers the upper surface and the side surfaces of the metal data interface 12, to prevent the side surfaces of the metal data interface 12 from being damaged, to further protect the metal data interface 12.

For example, the material of the conductive pattern 14 is a metal oxide subjected to the conduction-enabling process.

Here, the metal oxide can be a transparent metal oxide or a non-transparent metal oxide, which can be obtained by enabling a semiconductor material to be conductive.

For example, the material of the conductive pattern 14 can be a conductive material obtained by hydrogenating CAAC-IGZO. CAAC means c-axis aligned crystalline, IGZO means indium gallium zinc oxide In—Ga—Zn—O.

In the embodiment of the present disclosure, the material of the conductive pattern 14 is the metal oxide subjected to the conduction-enabling process which is mature and has a low cost.

Figure 5:
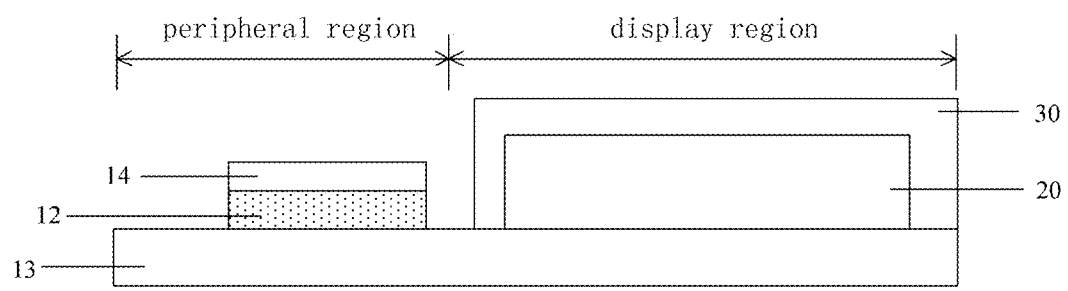
FIG. 5 is another schematic structural diagram of a display apparatus provided by an embodiment of the present disclosure.

For example, as shown in FIG. 5, the display apparatus further comprises a display device 20 disposed on the silicon substrate 13, and the display device 20 comprises a liquid crystal display device or an organic electroluminescent diode.

For example, as shown in FIG. 5, the display apparatus comprises a display region and a peripheral region located at a periphery of the display region, the display device is located in the display region, and the plurality of metal data interfaces are located in the peripheral region. In addition, for the display region and the peripheral region of the display apparatus, FIG. 4 can be referred, and the region where the pixel circuit array 01 shown by the broken line frame in FIG. 4 is located can be regarded as the display region, and the other region around the periphery of the display region can be regarded as the peripheral region. An example in which the peripheral region is located at both sides of the display region is shown in FIG. 4, however, embodiments according to the present disclosure are not limited to this.

The display apparatus further comprises a package device 30 which isolates the display apparatus 20 from the outside, and the package device 30 is a multilayer organic film, a polymer film, an inorganic film, glass, or the like.

For example, the display apparatus further comprises a circuit board which is electrically connected to the metal data interface 12.

The circuit board comprises a vertical drive circuit 03, a horizontal drive circuit 04, and the like.

Figure 6:
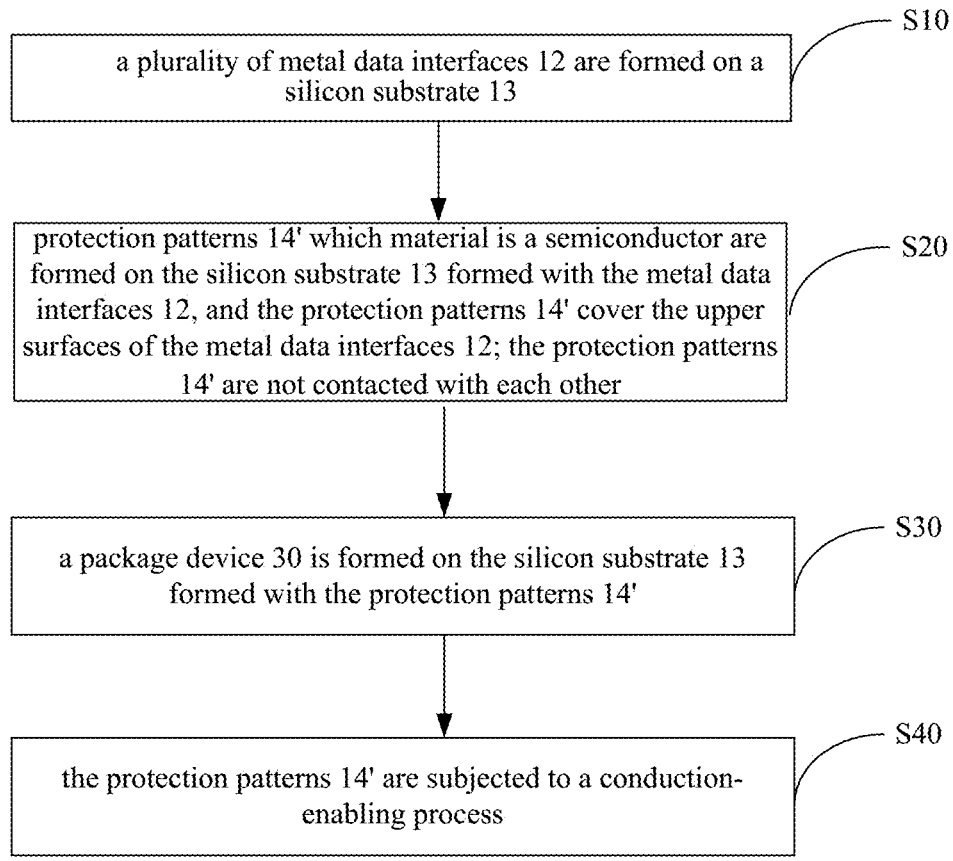
FIG. 6 is a flowchart of a manufacturing method of a display apparatus provided by an embodiment of the present disclosure.
Figure 7A:
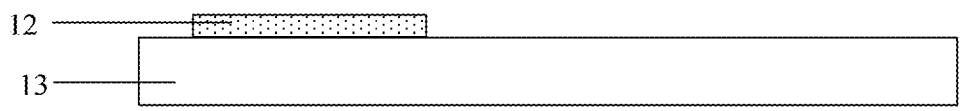
FIGS. 7(*a*)-7(*e*) are schematic diagrams showing a manufacturing process of a display apparatus provided by an embodiment of the present disclosure.

An embodiment of the present disclosure further provides a manufacturing method of a display apparatus, as shown in FIG. 6, comprising:

S10. as shown in FIG. 7(a), a plurality of metal data interfaces 12 are formed on a silicon substrate 13.

The metal data interfaces 12 can be formed by a patterning process, for example.

Figure 7B:
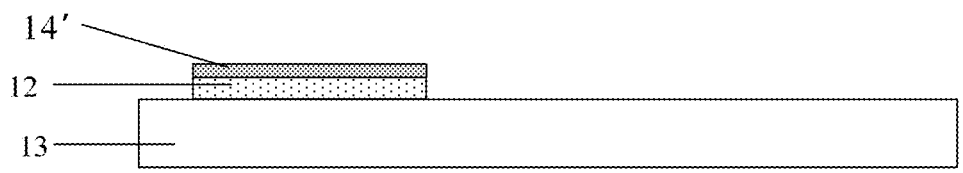

S20. as shown in FIG. 7(b), protection patterns 14' which material is a semiconductor are formed on the silicon substrate 13 formed with the metal data interfaces 12, and the protection patterns 14' cover the upper surfaces of the metal data interfaces 12; the protection patterns 14' are not contacted with each other.

That is, the metal data interfaces 12 are protected by the protection patterns 14' with a material of semiconductor. The plurality of protection patterns 14' are not contacted with each other.

Figure 7C:
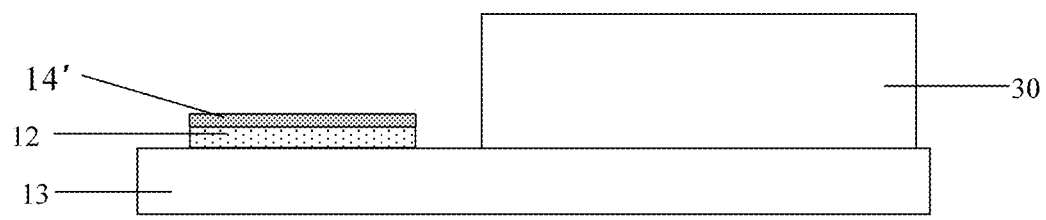

S30. as shown in FIG. 7(c), a package device 30 is formed on the silicon substrate 13 formed with the protection patterns 14'.

That is, after the protection patterns 14' of semiconductor material are formed, the display apparatus 20, the package device 30, and the like are subsequently formed to complete the manufacturing of each structure of the display apparatus.

Figure 7D:
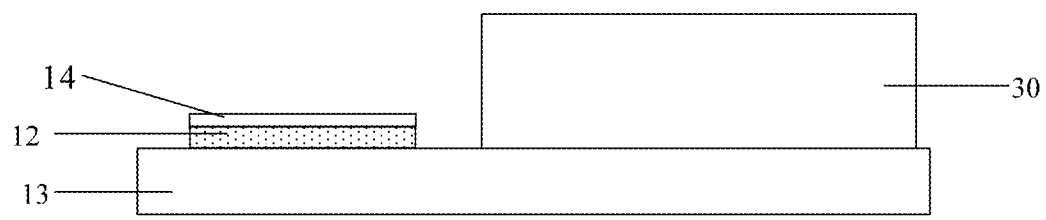

S40. as shown in FIG. 7(d), the protection patterns 14' are subjected to a conduction-enabling process.

That is, when each layer of the display apparatus has been manufactured and it is ensured that the metal data interfaces 12 are no longer damaged, the protection patterns 14' of semiconductor material are enabled to be conductive, to form conductive patterns 14 of a conductor material.

In the embodiments of the present disclosure, the method of the conduction-enabling process is not limited, and the corresponding method of the conduction-enabling can be selected according to the specific semiconductor material.

Figure 7E:
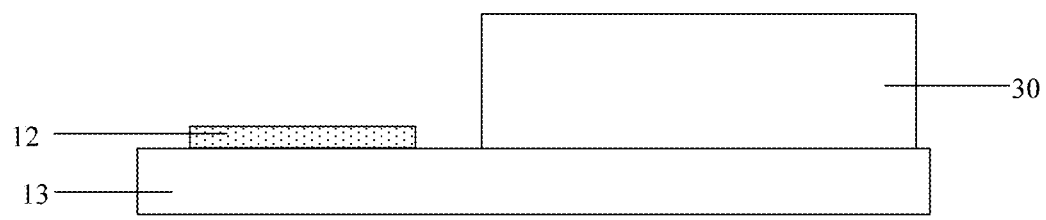

Alternatively, another manufacturing method is provided, and step S41 is performed on the basis of step S30: as shown in FIG. 7(e), the protection patterns 14' are removed.

Those skilled in the art should understand that, in order to ensure the package performance of the package structure 30, the package structure 30 should not be damaged when the protection patterns 14' are removed.

In the manufacturing method of the display apparatus provided by the embodiment of the present disclosure, at the time of initial manufacture, the protection patterns 14' of semiconductor material are formed, and at this time, the protection patterns 14' can prevent the metal data interfaces 12 from being damaged when the display device is manufactured on the silicon substrate 13. Moreover, the protection patterns 14' of semiconductor material can also avoid affecting other film layers of the display device, thereby improving the yield of the display apparatus. After the display device is packaged, the protection patterns 14' of semiconductor material are enabled to be conductive, to convert them into conductive patterns 14 of conductor material, or the protection patterns 14' of semiconductor material are directly removed to expose the metal data interfaces 12, to achieve electrical connection with the metal data interfaces 12, which does not affect the use of the metal data interfaces 12, reduces adverse effects of the photoresist process on the device performance and improves the performance of the device.

For example, the step of forming the protection patterns 14' comprises forming a semiconductor thin film on the silicon substrate 13 formed with the metal data interfaces 12, and forming the protection patterns 14' by one patterning process.

For example, a layer of CAAC-IGZO thin film can be formed on the silicon substrate 13 formed with the metal data interfaces 12, and the CAAC-IGZO thin film can be patterned by a mask to form the protection patterns 14'.

When the display apparatus 20 is an organic electroluminescent diode, the manufacturing method further comprises forming an evaporation layer, such as an electrode layer, an electroluminescent layer (EL) and the like, on the silicon substrate 13 formed with the protection patterns 14'. After the manufacture of the display apparatus 20 is completed, the display device is packaged.

For example, the step of enabling the protection patterns 14' to be conductive comprises hydrogenating the protection patterns 14' to enable the protection patterns to be conductive.

For example, after the display apparatus is packaged, the protection patterns 14' with the material of CAAC-IGZO on the surfaces of the metal data interfaces 12 are hydrogenated, so that the protection patterns 14' are enabled to be conductive so as to be converted into conductive patterns 14.

In the embodiments of the present disclosure, the conductive patterns are formed by treating the CAAC-IGZO material with hydrogenating process which is mature and has low cost.

A manufacturing method of a display apparatus according to some embodiments of the present disclosure comprises the following steps:

S100, forming a plurality of metal data interfaces 12 on the silicon substrate 13.

S200, forming protection patterns 14' with a material of CAAC-IGZO on the silicon substrate 13 formed with the metal data interfaces 12, wherein the protection patterns 14' cover upper surfaces of the metal data interfaces 12, and the protection patterns 14' are not contacted with each other.

S300, forming a display device 20 on the silicon substrate 13 formed with the protection patterns 14'.

S400, forming a package device 30 on the silicon substrate 13 formed with the display device 20.

S500, hydrogenating the protection patterns 14' to convert them into conductive patterns 14.

What are described above is related to the illustrative embodiments of the disclosure only and not limitative to the scope of the disclosure; the scopes of the disclosure are defined by the accompanying claims.

The invention claimed is:

1. A display apparatus, comprising a silicon substrate, a plurality of metal data interfaces disposed on the silicon substrate, and a plurality of conductive patterns covering upper surfaces of the plurality of metal data interfaces respectively, wherein the plurality of conductive patterns is formed by enabling a semiconductor material to be conductive, and the plurality of the conductive patterns are not contacted with each other;
wherein the display apparatus further comprises a drive circuit connected to the metal data interfaces.

2. The display apparatus according to claim 1, wherein an orthographic projection of each of the conductive patterns on the silicon substrate coincides with an orthographic projection of a corresponding metal data interface on the silicon substrate.

3. The display apparatus according to claim 1, wherein an orthographic projection of each of the conductive patterns on the silicon substrate covers an orthographic projection of a corresponding metal data interface on the silicon substrate.

4. The display apparatus according to claim 1, wherein a material of the conductive patterns is a metal oxide which is subjected to a conduction-enabling process.

5. The display apparatus according to claim 1, further comprising a display device disposed on the silicon substrate, wherein the display device comprises a liquid crystal display device or an organic electroluminescent diode.

6. The display apparatus according to claim 5, wherein the display apparatus comprises a display region and a peripheral region located at a periphery of the display region, the display device is located in the display region, and the plurality of the metal data interfaces are located in the peripheral region.

7. The display apparatus according to claim 1, wherein each of the conductive patterns covers an upper surface and side surfaces of a corresponding metal data interface.

8. The display apparatus according to claim 1, the plurality of conductive patterns is formed by enabling CAAC-IGZO to be conductive.

9. The display apparatus according to claim 8, the plurality of conductive patterns is formed of hydrogenated CAAC-IGZO.

10. A manufacturing method of a display apparatus comprising:
forming a plurality of metal data interfaces on a silicon substrate;
forming protections pattern with a material of semiconductor on the silicon substrate formed with the metal data interfaces, so that the protection patterns cover upper surfaces of the metal data interfaces, wherein the protection patterns are not contacted with each other;
forming a display device on the silicon substrate formed with the protection patterns.

11. The manufacturing method according to claim 10, further comprising:
forming a package device on the display device; and
after forming the package device, enabling the protection patterns to be conductive, or removing the protection patterns.

12. The manufacturing method according to claim 10, wherein forming the protection patterns comprises:
forming a semiconductor thin film on the silicon substrate formed with the metal data interfaces, and forming the protection patterns by one patterning process.

13. The manufacturing method according to claim 12, wherein a material of the semiconductor thin film is CAAC-IGZO.

14. The manufacturing method according to claim 13, wherein enabling the protection patterns to be conductive comprises:
hydrogenating the protection patterns to enable the protection patterns to be conductive.

* * * * *